(12) United States Patent
Beck et al.

(10) Patent No.: US 11,411,564 B2
(45) Date of Patent: Aug. 9, 2022

(54) RAPID SINGLE FLUX QUANTUM PULSE MULTIPLIER

(71) Applicant: INTERNATIONAL BUSINESS MACHINES CORPORATION, Armonk, NY (US)

(72) Inventors: Matthew Beck, Danbury, CT (US); John Timmerwilke, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 28 days.

(21) Appl. No.: 17/118,526

(22) Filed: Dec. 10, 2020

(65) Prior Publication Data
US 2022/0190830 A1 Jun. 16, 2022

(51) Int. Cl.
*H03K 19/195* (2006.01)
*H03K 3/38* (2006.01)

(52) U.S. Cl.
CPC ............. *H03K 19/195* (2013.01); *H03K 3/38* (2013.01)

(58) Field of Classification Search
CPC ................................ H03K 19/195; H03K 3/38
See application file for complete search history.

(56) References Cited

U.S. PATENT DOCUMENTS

| | | | |
|---|---|---|---|
| 5,963,351 A * | 10/1999 | Kaplounenko | H03K 3/38 329/346 |
| 6,188,236 B1 | 2/2001 | Wikiborg | |
| 6,420,895 B1 * | 7/2002 | Herr | H04L 7/0276 326/1 |
| 6,724,216 B2 | 4/2004 | Suzuki et al. | |
| 7,129,869 B2 | 10/2006 | Furuta et al. | |
| 8,050,648 B1 * | 11/2011 | Kirichenko | H03D 7/005 327/407 |
| 9,906,191 B1 | 2/2018 | Hypres | |
| 10,331,163 B1 * | 6/2019 | Luo | H01L 39/223 |
| 2020/0243133 A1 * | 7/2020 | Gingrich | G11C 11/1675 |

OTHER PUBLICATIONS

Herr, Q., "Stacked Double-Flux-Quantum Output Amplifier"; IEEE Transactions on Applied Superconductivity (2005); vol. 15:2; pp. 259-262.
Saito, J. et al., "Design and Functional Tests of Variable SFQ Pulse Number Multiplier"; Physica C (2011); vol. 471 pp. 1270-1273.

(Continued)

*Primary Examiner* — Sibin Chen
(74) *Attorney, Agent, or Firm* — Intelletek Law Group, PLLC; Gabriel Daniel, Esq.

(57) ABSTRACT

A method of generating an output signal based on a single flux quantum (SFQ) pulse includes receiving the SFQ pulse and splitting it into a first path and a second path. The split SFQ pulse of the second path is stored in a latch. A second splitting of the split SFQ pulse of the first path is provided to provide a first output signal and a second output signal of the first path. The second output signal is delayed by a delay Josephson transmission line (JTL). An output of the delay JTL is provided as a clock input to the latch. The first output of the first path is recombined with an output of the latch to provide an output signal.

19 Claims, 6 Drawing Sheets

(56) References Cited

OTHER PUBLICATIONS

Suzuki, M. et al., "Design and Operation of a Pulse-Number Multiplier for a High-Precision RSFQ D/A Converter"; IEEE Transactions on Applied Superconductivity (2005); vol. 15:2; pp. 336-339.
Yoshida, A. et al., "Characteristics of Superconducting First-Order Sigma-Delta Modulator With Clock-Doubler Circuit"; IEEE Transactions on Applied Superconductivity (2007); vol. 17:2; 4 pgs.
International Search Report and Written Opinion dated Apr. 12, 2022 in related international patent application No. PCT/EP2021/084857; 11 pgs.

* cited by examiner

RAPID SINGLE FLUX QUANTUM PULSE MULTIPLIER

BACKGROUND

Technical Field

The present disclosure generally relates to superconducting devices, and more particularly, multipliers that can be used in superconducting environments.

Description of the Related Art

A single flux quantum (SFQ) pulse is created when the superconducting phase difference across a resistively shunted Josephson Junction (JJ) evolves by $2\pi$. From the second Josephson relation, SFQ pulses have a quantized area $\int V(t)dt = \Phi_0 \approx 2.07 \times 10^{-15}$ Wb = 2.07 mV·ps = 2.07 mA-pH. Such pulses can be as narrow as 1 ps with an amplitude of about 2 mV, or broader (e.g., 5-10 ps) with correspondingly lower amplitude, based on the parameters of the JJs.

As used herein, a rapid single flux quantum (RSFQ) circuit is a digital electronic circuit that uses superconducting devices, such as JJs, to process digital signals. In RSFQ logic, information is stored in the form of magnetic flux quanta and transferred in the form of SFQ voltage pulses mentioned above.

SUMMARY

According to various embodiments, a circuit and method of generating an output signal based on a single flux quantum (SFQ) pulse are provided. An SFQ pulse is received. The SFQ pulse is split into a first path and a second path. The split SFQ pulse of the second path is stored in a latch. A second splitting of the split SFQ pulse of the first path is performed to provide a first output signal and a second output signal of the first path. The second output signal is delayed by a delay Josephson transmission line (JTL). An output of the delay JTL is provided as a clock input to the latch. The first output of the first path is recombined with an output of the latch to provide an output signal.

In one embodiment, the latch is a D-latch and the split SFQ pulse of the second path is stored in the latch as a circulating supercurrent.

In one embodiment, the recombination of the first output of the first path with an output of the latch is by way of a confluence buffer.

In one embodiment, the split SFQ pulse is passed through one or more Josephson transmission lines (JTLs) to a first splitter. An output of the latch is passed through one or more JTLs to a confluence buffer.

In one embodiment, the delay JTL includes a series chain of n JTL stages, each having a nominal current bias resulting in a delay $\Delta t$, wherein $\Delta t = n \times \Delta t'$, where $\Delta t'$ is a temporal pulse delay per JTL stage.

In one embodiment, the delay JTL includes a series chain of n JTL stages and is configured to receive a controllable global bias current such that a resulting delay $\Delta t = n \times \Delta t'(I_b)$ where $\Delta t'(I_b)$ is a temporal pulse delay per JTL stage as a function of a bias current $I_b$.

In one embodiment, the delay JTL includes a series chain of n JTL stages, each stage having its own independent bias current such that a resulting delay $\Delta t = \Sigma_i^n \Delta t_i(I_{b,i})$, where $\Delta t_i(I_{b,i})$ is a delay of the ith stage as a function of its bias current $I_b$.

In one embodiment, an even order of frequency multiplication of the received SFQ pulse is provided by setting a delay of the delay JTL to be $\Delta t/2^n$, such that an output train of pulses of the output signal have a pulse-to-pulse spacing of $\Delta t/2^n$, where $\Delta t$ is the input pulse-to-pulse temporal spacing and n is the number of the pulse doubler stage in a series chain of N cascaded stages. For each doubler stage n in a chain of N cascaded doublers, the pulse to pulse spacing is reduced by $\Delta t/2^n$. After N stages, the final pulse-to-pulse spacing is $\Delta t/2^N$.

In one embodiment, an odd order of frequency multiplication of the received SFQ pulse is provided by providing at least two serially cascaded stages of the method, with the first stages having a delay of the delay JTL set to $2\Delta t/3$ and the delay of the second delay JTL set to $\Delta t/3$, where $\Delta t$ is the input signal pulse-to-pulse spacing.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, to RSFQ pulse multipliers that can be used in superconducting environments. RSFQ electronics traditionally have operated at very low voltages (e.g., 10's microvolts). Such low voltage operation has made interfacing between RSFQ and complementary metal oxide semiconductor (CMOS) difficult in efforts to combine the two technologies. Moreover, the measurement of such small voltages is challenging, typically requiring room temperature amplification. A cause of the small operating voltage is the quantum mechanical relation between operating frequency and voltage, the superconducting magnetic flux quantum $\Phi_0 = 2.067 \times 10^{-15}$ W. In this regard, it is noted that the frequency to voltage conversion is simply $V = \Phi_0 *$ freq. For example, with $\Phi_0$, microwave circuits only produce microvolts of DC voltage.

In various embodiments, the teachings herein provide a frequency multiplier that can provide an even or odd multiple of the original input frequency of an SFQ signal. An SFQ pulse is split into separate paths, where the split SFQ pulse of the second path is stored in a latch, such as a D-Latch. The split SFQ pulse of the first path is split again by way of a second splitter with one pulse sent to the output and another to the CLK input of the latch by way of a delay JTL. The first path and the second path are then recombined by way of a confluence buffer. In one aspect, by virtue of tuning the delay via current bias, variable levels of multiplication can be selected. When two cascaded stages have the same delay only a single pulse is added to the train, therefore, assuming all delay JTLs use the same number of stages, for n stages multiplication, factors from 1+n to 2^n can be achieved. Each of these concepts is discussed in more detail below.

Example Block Diagram

Figure 1:
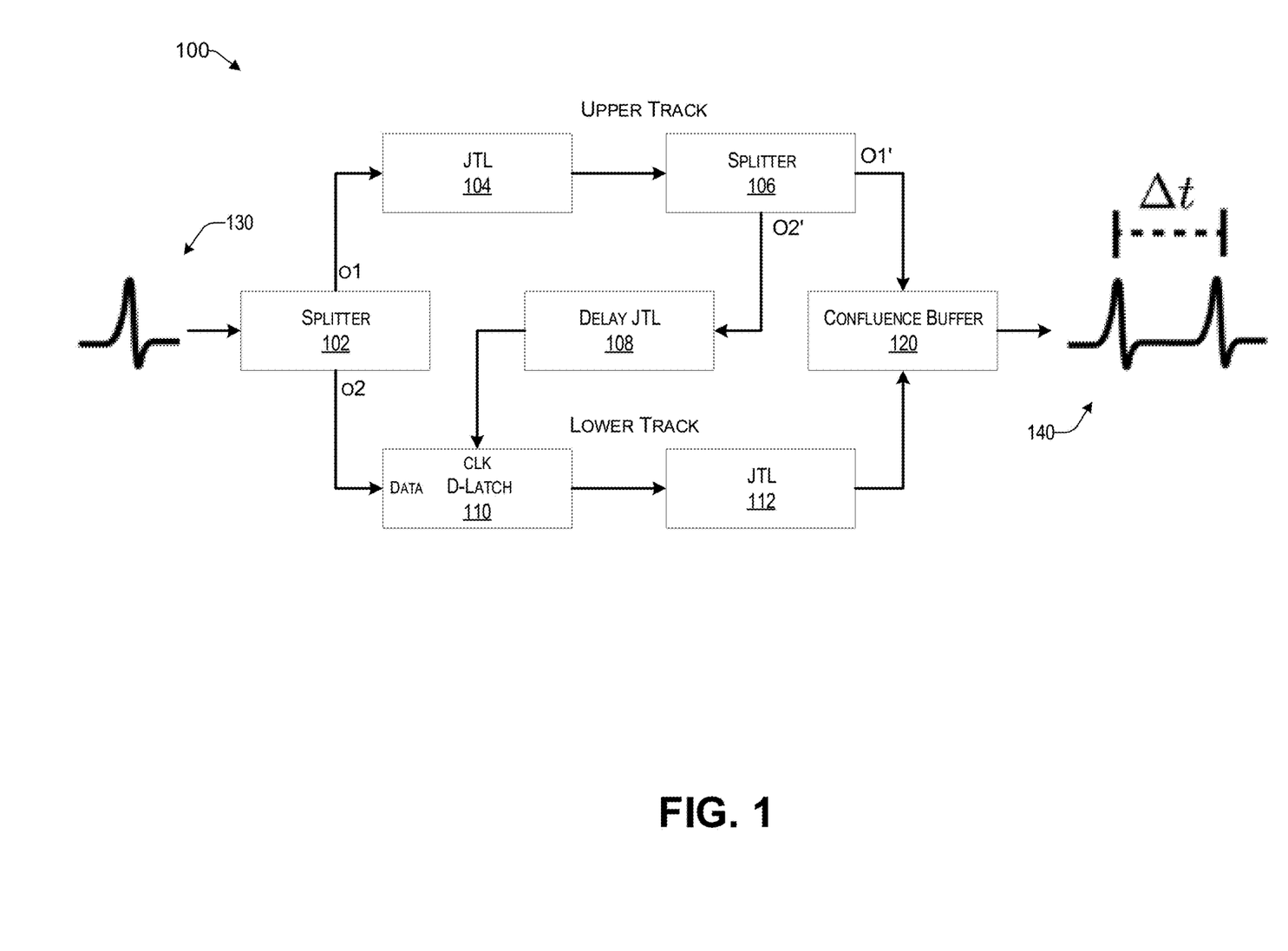
FIG. 1 is a block diagram of a pulse doubler, consistent with an illustrative embodiment.

FIG. 1 is a block diagram of a pulse doubler 100, consistent with an illustrative embodiment. The pulse doubler 100 includes a first splitter 102 having a first output O1 and a second output O2. There is a second splitter 106 coupled to a first output O1 of the first splitter 102. There is a delay element 108 coupled to a second output O2' of the second splitter 106. In one embodiment, the delay element 108 is a Josephson transmission line (JTL) that is operative to provide a delay, discussed in more detail below. There is a latch 110 having a data input coupled to the second output O2 of the first splitter 102 and a clock input coupled to an output of the delay JTL 108. In one embodiment, the latch is a D-latch. There is a recombination circuit 120 configured to receive the first output O1' of the second splitter 106 and an output of the latch 110 to provide a recombined output. In one embodiment, the recombination circuit 120 is a confluence buffer.

In one embodiment, there are one or more Josephson transmission lines (JTLs) coupled between the first output O1 of the first splitter 102 and an input of the second splitter 106. Similarly, there may be one or more JTLs coupled between the output of the latch 110 and the second input of the recombination circuit 120.

A single SFQ pulse 130 enters into the first splitter circuit 102, where two copies of it are generated and passed to the first (e.g., upper) and second (e.g., lower) tracks, respectively. The lower track pulse is provided to the latch (e.g., D-Latch) circuit 110 at its DATA input, where the signal is stored as a circulating supercurrent.

The upper track pulse is fed into a second splitter 106, where the split SFQ pulse of the first (upper track) is copied to provide two separate signals. The split SFQ signal of the second output O2' of the second splitter 106, sometimes referred to herein as the upper track copy, is provided to the delay JTL 108. In various embodiments, the delay JTL 108 may have different configurations. For example, the delay JTL 108 may comprise a series chain of n JTL stages, each having a nominal current bias resulting in a delay $\Delta t = n \times \Delta t'$, where $\Delta t'$ is the temporal pulse delay per JTL stage.

In one embodiment, the delay JTL 108 comprises a series chain of n JTL stages and configured to receive a controllable (e.g., by a user on a controller) global bias current such that the resulting delay is $\Delta t = n \times \Delta t'(I_b)$ where $\Delta t'(I_b)$ is the temporal pulse delay per JTL stage as a function of bias current $I_b$.

In one embodiment, the delay JTL 108 comprises a series chain of n JTL stages each stage with its own independent bias current such that resulting delay is $\Delta t = \Sigma_i^n \Delta t_i(I_{b,i})$, where the sum is taken over n stages of JTL and $\Delta t_i(I_{b,i})$ is the delay of the $i^{th}$ stage as a function of its bias current.

The upper track copy of the second splitter 106 at its output O2' that has been delayed by the delay JTL 108 is provided to a CLK input of the D-Latch, which triggers the second output O2 of the first splitter 102 to be released from the D latch 110 and passed to the confluence buffer 120 via the lower track JTL 112.

Both the upper track pulse provided at the output O1' of the second splitter 106 and the temporally delayed lower track pulse provided at the output of the D-Latch 110 (which may be via the JTL 112) are combined into a single track via the recombination circuit (e.g., confluence buffer) 120 resulting in two pulses 140 with a time separation $\Delta t$.

Example Circuit Components

Figure 2A:
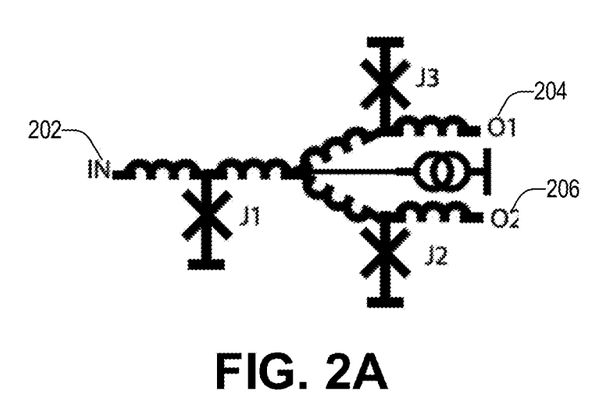
FIG. 2A provides a circuit diagram of an example RSFQ pulse splitter, consistent with an illustrative embodiment.

FIGS. 2A to 2D provide different example building blocks of the pulse doubler 100 of FIG. 1, consistent with illustrative embodiments. More specifically, FIG. 2A provides a circuit diagram of an example RSFQ pulse splitter. A single input SFQ pulse arriving at the input IN 202 triggers junctions J1, J2, and J3, producing output SFQ pulses at the output terminals O1 (204) and O2 (206), respectively, representing copies of the input SFQ pulse.

Figure 2B:
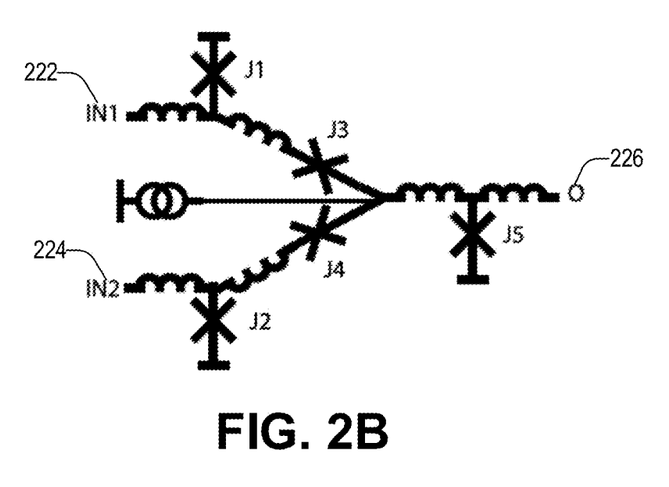
FIG. 2B is a circuit diagram of an example RSFQ confluence buffer, consistent with an illustrative embodiment.
Figure 2C:
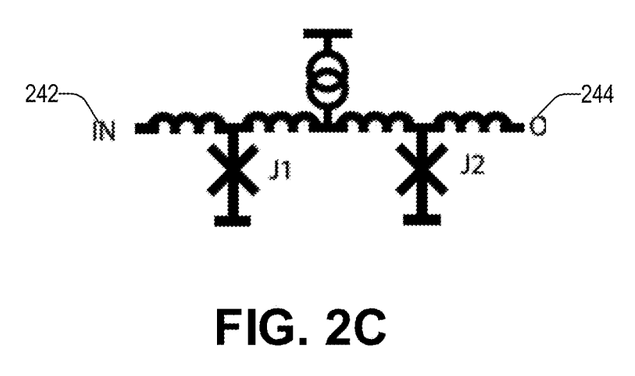
FIG. 2C is a circuit diagram of an example Josephson transmission line, consistent with an illustrative embodiment.

FIG. 2B is a circuit diagram of an example RSFQ confluence buffer. Pulses arriving at input IN1 (222) trigger junctions J1, J4, and J5. Junction J5 switching provides the output pulse to O (226) while series junction J4 prevents back propagation of a pulse at IN1 to IN2. Pulses arriving at IN2 (224) trigger junctions J2, J3, and J5. Junction J5 switching provides the output pulse to O (226) while series junction J3 prevents back propagation of pulses at IN2 to IN1. When pulses arriving at IN1 (222) and (224) are temporally separated, two distinct pulses will be received at the output O (226). Should pulses arriving at IN1 and IN2 be commensurate in time, only a single output pulse will be produced at O (226). FIG. 2C is a circuit diagram of an example Josephson transmission line. RSFQ pulses arriving at the input IN (242) trigger junctions J1 and J2, sequentially producing a single SFQ pulse at the output 244.

Figure 2D:
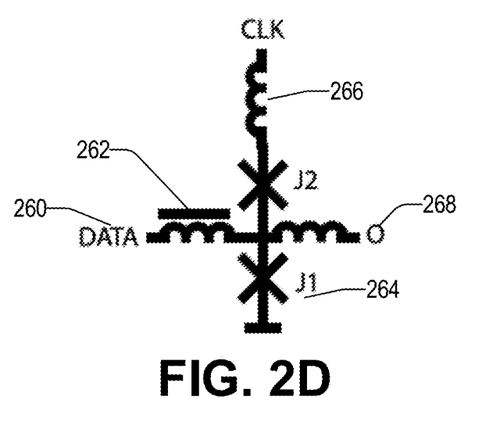
FIG. 2D is a circuit diagram of an example D-Latch circuit, consistent with an illustrative embodiment.

FIG. 2D is a circuit diagram of an example D-Latch circuit. An SFQ pulse arriving at the DATA port 260 is stored as a circulating current in the storage inductor 262 forward biasing junction J1 (264). When a pulse arrives at the CLK port, the combination of the storage current and the pulse current trigger junction J1 (264) producing an SFQ pulse at the output O (268). Should an SFQ pulse not arrive at the DATA input 260 during a particular clock cycle, the CLK pulse is dropped across junction J2 (266) and no output 268 is produced.

Figure 3:
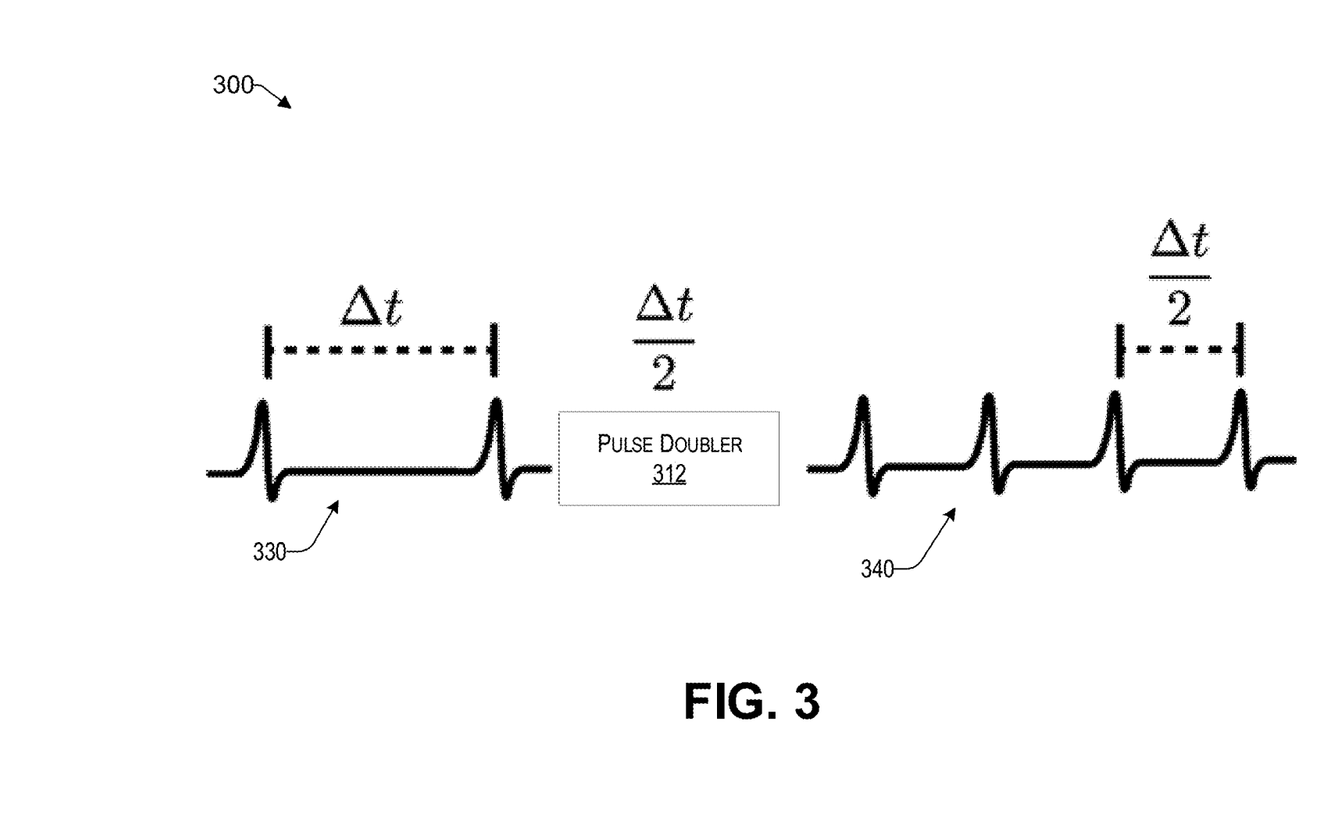
FIG. 3 is a conceptual block diagram of pulse frequency doubling for even orders of multiplication, consistent with an illustrative embodiment.

Explanation of Frequency Multiplication for Even and Odd Orders:

Reference now is made to FIG. 3, which is a conceptual block diagram 300 of pulse frequency doubling for even orders of multiplication, consistent with an illustrative embodiment. A pulse train 330 with pulse-to-pulse spacing $\Delta t$ is provided to a pulse doubler circuit 312. In the example of FIG. 3, the delay between the upper and lower tracks is set to be $\Delta t/2$, such that the output train of pulses 340 now have a pulse-to-pulse spacing $\Delta t/2$, thereby effectively doubling the frequency of the input pulse train 330. Cascaded stages of pulse doublers with sequential top and bottom track delays of $\Delta t/2^n$, where n denotes what stage the pulse doubler is can achieve 2^N factors of multiplication of the initial pulse train frequency where N is the total number of pulses doubler stages.

For example, an exponential frequency multiplication can be achieved by cascading stages where the delay of each stage is $\Delta t/2^n$, where n is the stage number. The total frequency multiplication would then be 2^N where N is the total number of stages.

Figure 4:
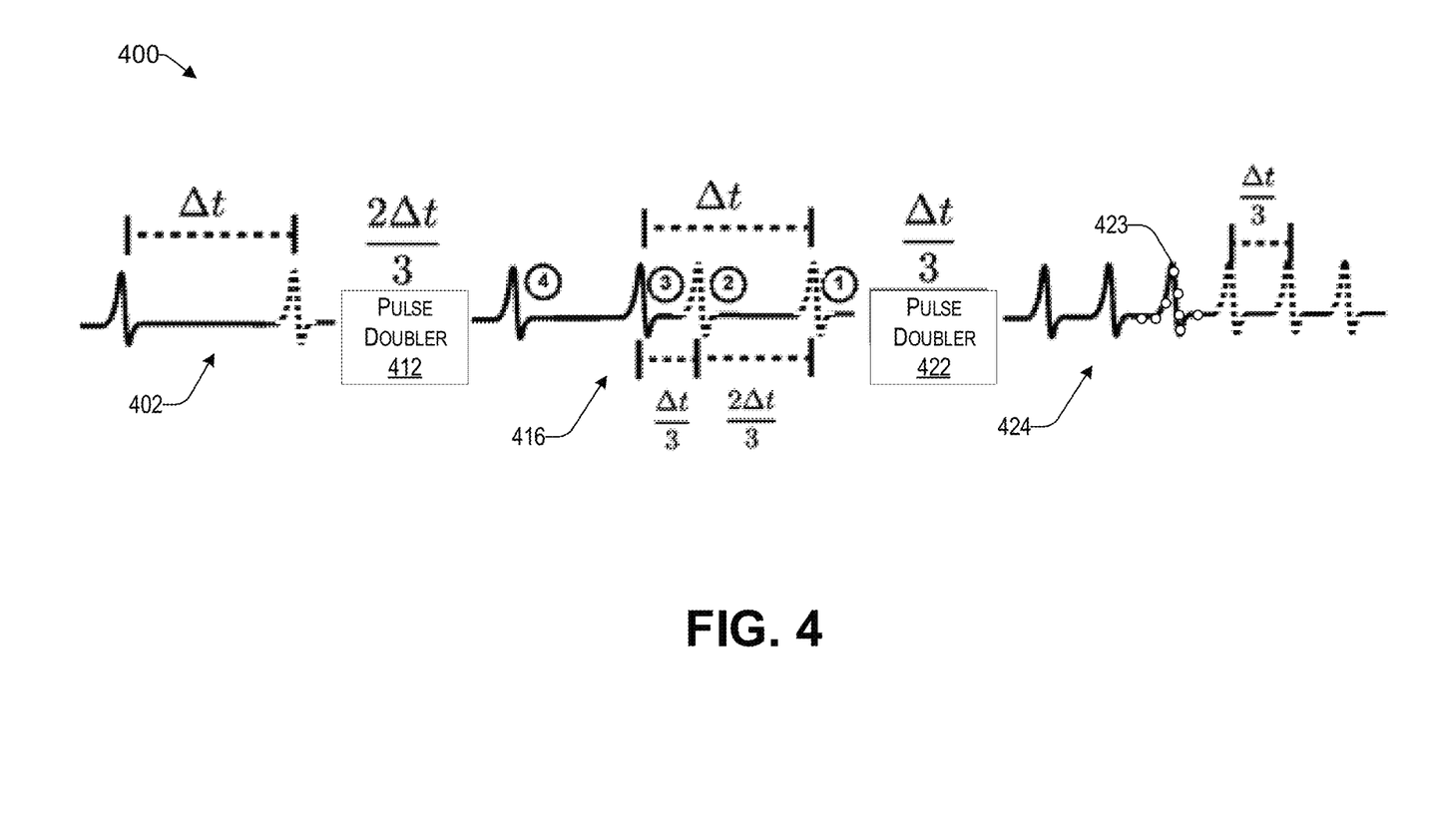
FIG. 4 is a conceptual block diagram of pulse frequency multiplication that achieves odd orders, consistent with an illustrative embodiment.

The teachings herein also support an odd order of frequency multiplication. In this regard, FIG. 4 provides a conceptual block diagram 400 of pulse frequency multiplication that achieves odd orders, consistent with an illustrative embodiment. In order to achieve odd orders of multiplication in the initial pulse train 402 frequency, a minimum of two cascaded pulse doublers are used, represented by first and second doublers 412 and 424, respectively.

In the example of FIG. 4, a pulse train 402 with pulse to pulse spacing of $\Delta t$ is applied to the first pulse doubler 412. A different pattern (e.g., dashed vs. solid) of the pulses are used to better visually separate one period from the other. The initial pulse train 402 is fed into a first pulse doubler circuit 412, where the delay between the top and bottom track pulses is engineered to be $2\Delta t/3$. For example, for a known specific pulse to pulse spacing, to achieve a designed delay, the number of stages in the delay JTL can be determined via numerical modeling. For a delay JTL with bias current control, the delay could be controlled dynamically and accommodate different input pulse-to-pulse spacings. For two pulses 402 applied, a total of 4 pulses are produced, where the delay between the 1$^{st}$ and 2$^{nd}$ and the 3$^{rd}$ and 4$^{th}$ pulses is $2\Delta t/3$, and the delay between the 2$^{nd}$ and 3$^{rd}$ pulse is $\Delta t/3$.

This train of pulses 416 is then passed into a second pulse doubler 422, where the delay time between the upper and lower tracks is set to $\Delta t/3$. Because the delay of the second pulse doubler is commensurate with the pulse to pulse spacing between the 2$^{nd}$ and 3$^{rd}$ pulses emanating from the first stage doubler 412 in pulse train 416, the upper track pulse (3) and the delayed lower track pulse (2) will arrive at the 2$^{nd}$ stage pulse doubler 422 output confluence buffer at the same time, resulting in a singular output pulse (dotted waveform 423 in pulse train 424). The pulse doubler 422 has a confluence buffer at its output. By virtue of this alignment in time, odd orders of multiplication are facilitated.

Figure 5:
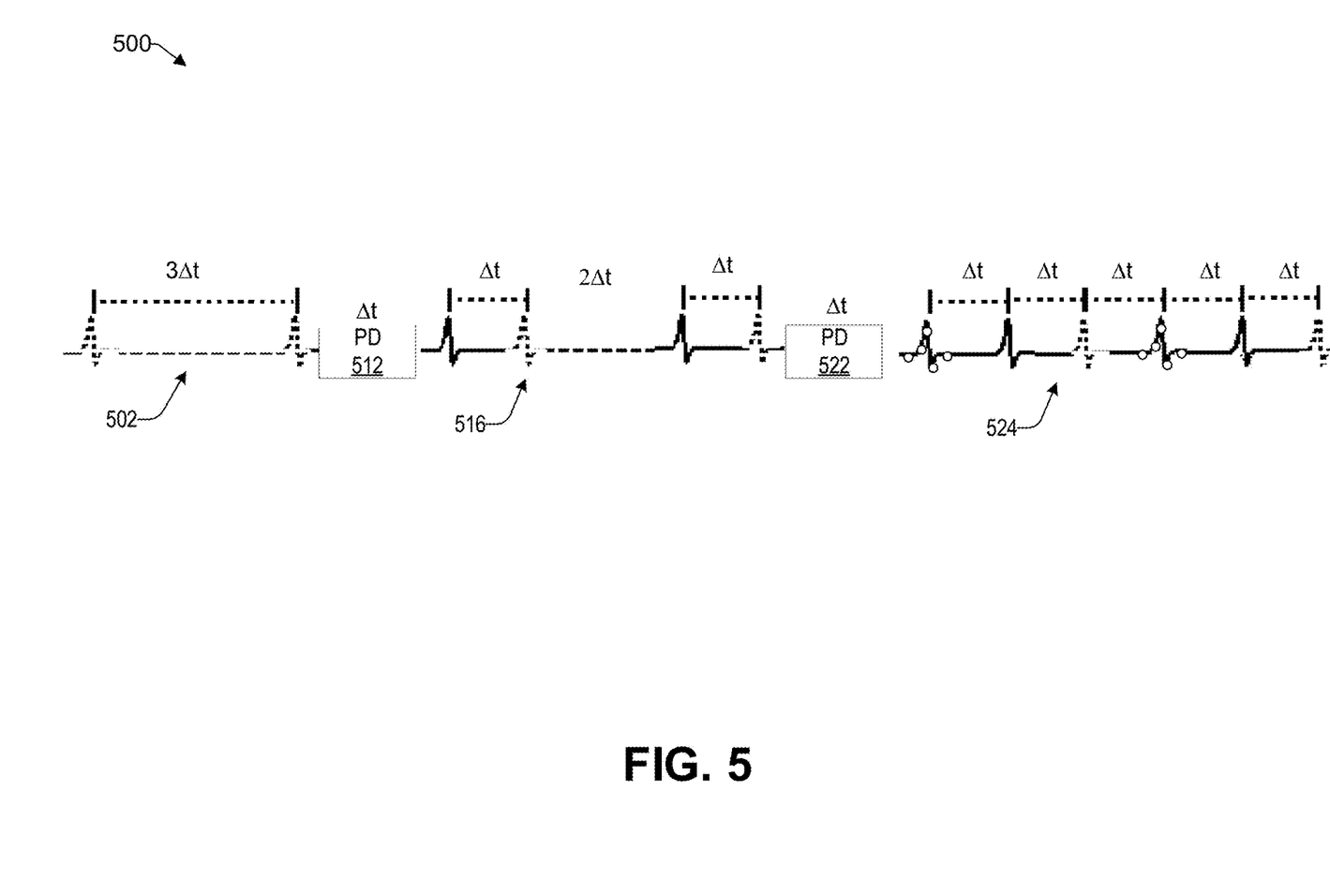
FIG. 5 is a conceptual block diagram of another pulse frequency multiplier that achieves odd orders, consistent with an illustrative embodiment.

Other odd orders of multiplication are contemplated by the teachings herein as well. For example, odd orders of multiplication can also be achieved by two pulse doublers having a same delay. In this regard, reference is made to FIG. 5, which is a conceptual block diagram 500 of another pulse frequency multiplier that achieves odd orders, consistent with an illustrative embodiment. In the embodiment of FIG. 5, the incoming SFQ signal 502 has a period of $3\Delta t$. When each pulse reaches the first pulse doubler 512, a copy of each signal is created and delayed by $\Delta t$ (e.g., the doubler can cause the delay via the delay JTL), resulting in 2 pairs of $\Delta t$ separated pulses with a $2\Delta t$ separation between the pairs. These four pulses 516 are then passed to a second pulse doubler 522.

The second pulse doubler 522 in turn creates a total of eight pulses, but because synchronous timing, the output of the duplicated pulse arising from the first (dashed) pulse in each pair aligns with the trailing (solid black) pulse, which, when combined commensurately in the confluence buffer discussed previously, results in a single output pulse. The process is repeated for the second pair of pulses emanating from the first pulse doubler 512, ultimately resulting in six total pulses 524 (or a frequency multiplication of three). In this way, any odd orders (e.g., 5, 7, 9) of multiplication can be achieved.

Figure 6:
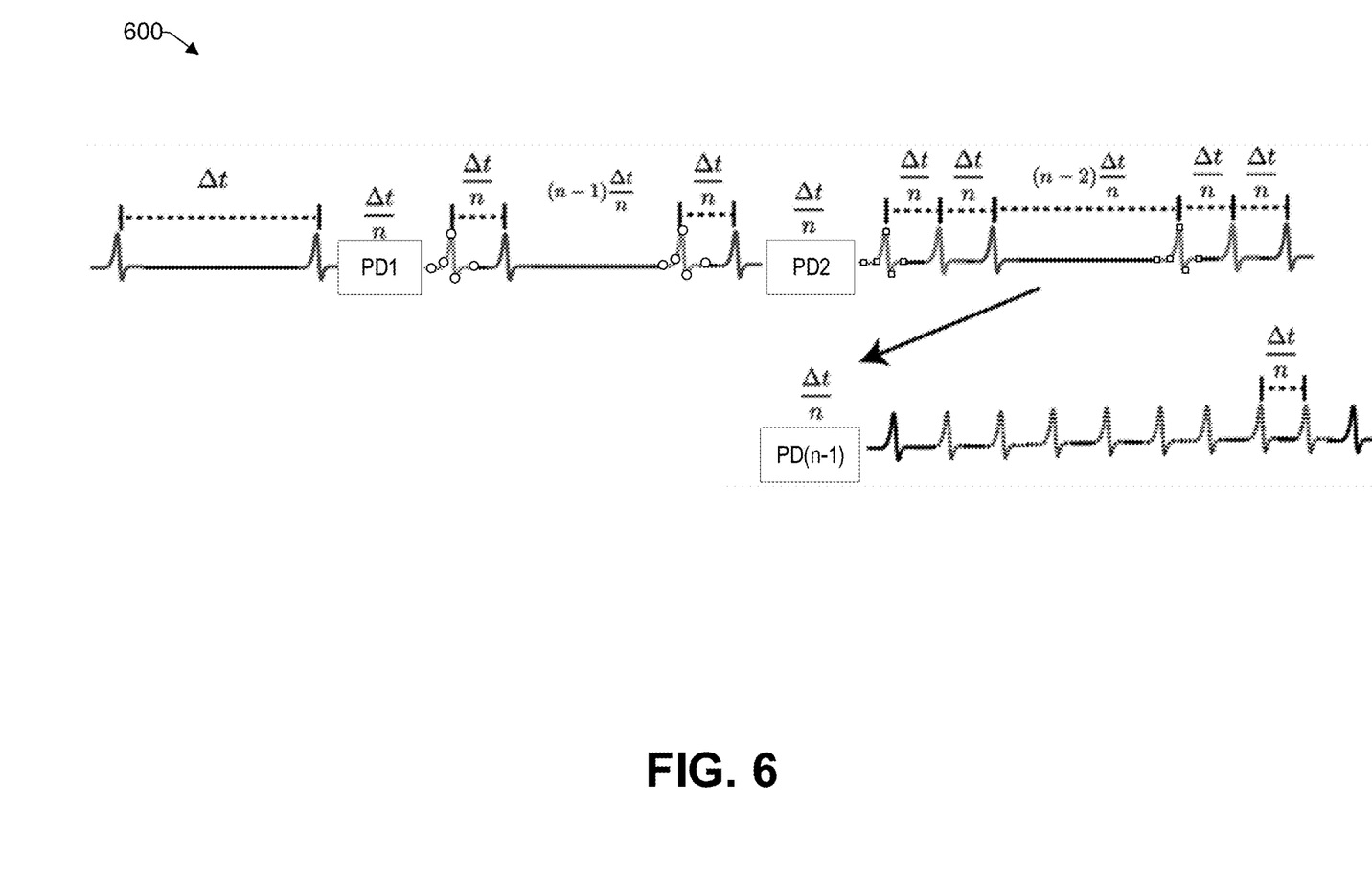
FIG. 6 is a conceptual block diagram of a pulse frequency multiplier that can achieve any order of multiplication, both even or odd, consistent with an illustrative embodiment.

Reference now is made to FIG. 6, which is a conceptual block diagram 600 of a pulse frequency multiplier that can achieve any order of multiplication, both even or odd, consistent with an illustrative embodiment. The example pulse doubler/frequency multiplier 600 can achieve any order of multiplication (even or odd) by simply cascading identical copies of the pulse doubler circuit n−1 times for a factor of n multiplication. For example, if N=5, then after 4 cascaded stages with delays $\Delta t/4$, a frequency multiplication factor of 5 is achieved. As to even ordered, exponential multiplication (i.e., factors of 2^n) a cascade of sequential pulse doublers can be used, each with a decreasing delay $\Delta t/2^n$ again where n is the stage of the pulse doubler. Accordingly, for a factor of 16 multiplication, the approach would only require 4 stages with delays $t/2$, $t/4$, $t/8$, $t/16$ (as opposed to 15 stages each with a delay time of $\Delta t/16$).

The teachings herein can be used not only for frequency multiplication but also in voltage amplification. For example, the time averaged DC voltage V measured across a JJ that is switched at a frequency F is $V=\Phi_0*F$. Thus, if frequency F is raised, the voltage is raised proportionally. For a 5 GHz signal measured in this way, the DC signal amplitude would be ~100 uV. If we do a 10× frequency multiplication, the time averaged DC signal measured would be ~100 uV. In various embodiments, the frequency and/or voltage multiplication can be static or dynamically set.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. The method of generating an output signal based on a single flux quantum (SFQ) pulse, the method comprising:
   receiving the SFQ pulse;
   splitting the SFQ pulse into a first path and a second path;
   storing the split SFQ pulse of the second path in a latch;
   providing a second splitting of the split SFQ pulse of the first path to provide a first output signal and a second output signal of the first path;
   delaying the second output signal by a delay Josephson transmission line (JTL);
   providing an output of the delay JTL as a clock input to the latch; and
   recombining the first output of the first path with an output of the latch to provide an output signal.

2. The method of claim 1, wherein:
   the latch is a D-latch; and
   the split SFQ pulse of the second path is stored in the latch as a circulating supercurrent.

3. The method of claim 1, wherein the recombination of the first output of the first path with an output of the latch is by way of a confluence buffer.

4. The method of claim 1, further comprising:
   passing the split SFQ pulse through one or more Josephson transmission lines (JTLs) to a first splitter; and
   passing an output of the latch through one or more JTLs to a confluence buffer.

5. The method of claim 1, wherein the delay JTL comprises a series chain of n JTL stages, each having a nominal current bias resulting in a delay $\Delta t$, wherein $\Delta t = n \times \Delta t'$, where $\Delta t'$ is a temporal pulse delay per JTL stage.

6. The method of claim 1, wherein the delay JTL comprises a series chain of n JTL stages and is configured to receive a controllable global bias current such that a resulting delay $\Delta t = n \times \Delta t'(I_b)$ where $\Delta t'(I_b)$ is a temporal pulse delay per JTL stage as a function of a bias current $I_b$.

7. The method of claim 1, wherein the delay JTL comprises a series chain of n JTL stages, each stage having its own independent bias current such that a resulting delay $\Delta t = \Sigma_i^n \Delta t_i(I_{b,i})$, where $\Delta tt(I_{b,i})$ is a delay of the $i^{th}$ stage as a function of its bias current $I_b$.

8. The method of claim 1, further comprising providing an exponential frequency multiplication of the received SFQ pulse train by setting a delay of each sequential delay JTL stage to be $\Delta t/2^n$, where n is a number of the delay JTL stage in a linear chain of N stages of the method, such that an output train of pulses of the output signal have a pulse-to-pulse spacing of $\Delta t/2^N$.

9. The method of claim 1, further comprising providing an odd order of frequency multiplication of the received SFQ pulse by providing at least two cascaded stages of the method, wherein a delay between an upper track and a lower track of pulses for a first doubler stage is $2\Delta t/3$ and a delay between an upper track and a lower track of pulses for a second doubler stage is $\Delta t/3$.

10. The circuit, comprising:
    a first splitter having a first output and a second output and configured to receive a single flux quantum (SFQ) pulse;
    a second splitter coupled to the first output of the first splitter;
    a delay Josephson transmission line (JTL) coupled to a second output of the second splitter;

a latch having a data input coupled to the second output of the first splitter and a clock input coupled to an output of the delay JTL; and a recombination circuit configured to receive the second output of the second splitter and an output of the latch to provide a recombined output.

11. The circuit of claim 10, wherein:

the latch is a D-latch; and the latch is configured to store the split SFQ pulse of the second path as a circulating supercurrent.

12. The circuit of claim 10, wherein the recombination circuit is a confluence buffer.

13. The circuit of claim 10, further comprising one or more JTLs coupled between the first splitter and the second splitter.

14. The circuit of claim 10, further comprising one or more JTLs coupled between the latch and the recombination circuit.

15. The circuit of claim 10, wherein the delay JTL comprises a series chain of n JTL stages, each having a nominal current bias resulting in a delay $\Delta t$, wherein $\Delta t = n \times \Delta t'$, where $\Delta t'$ is a temporal pulse delay per JTL stage.

16. The circuit of claim 10, wherein the delay JTL comprises a series chain of n JTL stages and is configured to receive a controllable global bias current such that a resulting delay $\Delta t = n \times \Delta t'(I_b)$ where $\Delta t'(I_b)$ is the temporal pulse delay per JTL stage as a function of a bias current $I_b$.

17. The circuit of claim 10, wherein the delay JTL comprises a series chain of n JTL stages, each stage having its own independent bias current such that a resulting delay is $\Delta t = \Sigma_i^n \Delta t_i(I_{b,i})$, wherein $\Delta t_i(I_{b,i})$ is a delay of the $i^{th}$ stage as a function of its bias current $I_b$.

18. The circuit of claim 10, wherein a delay of the delay JTL is set to be $\Delta t/2^n$, where n is a pulse doubler stage in a chain of N serially connected pulse doublers resulting in an output train of pulses of the output signal having a pulse-to-pulse spacing of $\Delta t/2^N$ thereby facilitating an even number of frequency multiplication of the received SFQ pulse.

19. The circuit of claim 10, wherein the circuit is part of a cascade of at least two stages configured to have a delay of each delay JTL to be $2\Delta t/3$, thereby facilitating an odd number of frequency multiplication of the received SFQ pulse.

* * * * *